US007791353B2

(12) United States Patent
Bellan (10) Patent No.: US 7,791,353 B2
(45) Date of Patent: Sep. 7, 2010

(54) GROUND LOOP LOCATOR (75) Inventor: Paul M. Bellan, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 312 days.

(21) Appl. No.: 12/069,776

(22) Filed: Feb. 13, 2008

(65) Prior Publication Data
US 2008/0191705 A1 Aug. 14, 2008

Related U.S. Application Data (60) Provisional application No. 60/901,571, filed on Feb. 13, 2007.

(51) Int. Cl.
G01R 31/08 (2006.01)
(52) U.S. Cl. ............... 324/529; 324/509; 324/157; 324/722
(58) Field of Classification Search ............... 324/509, 324/512, 523, 527, 529, 530, 157, 722
See application file for complete search history.

(56) References Cited

U.S. PATENT DOCUMENTS 4,075,675 A    2/1978   Burkett
6,377,053 B1 * 4/2002   Mazzucco et al. ........... 324/509

OTHER PUBLICATIONS

De la Pena, A., et al. Web-based ground loop supervision system for the TJ-II Stellerator. Fusion Engineering and Design, vol. 74, pp. 605-609, Nov. 2005.
Bellina, G., et al. *Earth Faults During RFX Initial Operations. Fusion Engineering,*, 1993, 15th IEEE/NPSS Symposium On, vol. 1, pp. 345-348, Oct. 1993.
Zunino, K. et al. *The ground fault detection system for the Tore Supra toroidal pump limiter, Fusion Engineering and Design*, vol. 66-68, pp. 1019-1023, Sep. 2003.
Suretest® Circuit Tracers Instruction Manual, Instruction Manual [online]. Ideal Industries, Inc. Retrieved on May 17, 2010. Retreived from the Internet: <URL: http://www.idealindustries.com/media/pdfs/products/instructions/nd-6364-2_circuit_tracer_instructions.pdf>.
Fluke 1630 Earth Ground Clamp Meter datasheet. Datasheet [online]. Fluke Corporation, 2006. Retrieved on May 17, 2010. Retrieved from the internet: <URL: http://support.fluke.com/find-sales/Download/Asset/2791074_6115_ENG_A_W.PDF>.
Fluke Saturn Geo X Advanced Three and Four Pole Earth Ground Tester datasheet. Datasheet/Instruction Manual [online]. Fluke Corporation, 2005 Retrieved on May 17, 2010. Retrieved from the internet: <URL: http://www.tequipment.net/pdf/Fluke/SaturnGeoX_datasheet.pdf>.

(Continued)

Primary Examiner—Vincent Q Nguyen
(74) Attorney, Agent, or Firm—Steinfl & Bruno (57) ABSTRACT Described is a ground loop locator. A readout on the ground loop locator indicates the presence of a ground loop when a ground loop exists in conductors linked by a current transformer of an exciter portion and a Rogowski coil of a detector portion. Also described are how to make and use the ground loop locator and methods of use for the ground loop locator.

24 Claims, 6 Drawing Sheets

OTHER PUBLICATIONS

Metrotech Pipe and Cable Locator, Model 480B. Instruction Manual [Online], Metrotech Corporation, 2007. retrieved on May 17, 2010, Retrieved from the internet: <URL: http://www.metrotech.com/UploadFiles/480B_PN_600A080_B.pdf>.

Biddle Megger Model 656902 Split-Box Pipe & Cable Locator, Brochure online. Retrieved on May 17, 2010. Retrieved from the internet: <URL: http://www.byramlabs.com/pdf/megger/SPLITBOX_DS_En_V01.pdf>.

Megger DET10C and DET20C Ground Resistance Clamp Testers. Instruction Manual [Online]. Retrieved on May 17, 2010. Retrieved from the internet: <URL: http://docs-europe.electrocomponents.com/webdocs/05a8/0900766b805a8fec.pdf>.

FM Systems CM-2 Camera Master II Instruction Manual [Online], FM Systems, Inc. 2006 Retrieved on May 17, 2010. Retrieved from the internet: <URL: http://www.fmsystems-inc.com/manuals/CM-2-ISB.pdf>.

Bender EDS Ground Fault Locator System [Online] Bender Inc. Retrieved on May 17, 2010. Retrieved from the internet: <URL: http://www.bender.org/documents/EDS.pdf>.

Bellan, P.M. Simple system for locating ground loops. Review of Scientific Instruments, vol. 78, 065104, Jun. 2007.

* cited by examiner

FIG. 4 ively to devices and methods for detecting ground loops using hand-held, portable AC exciters and receivers that are sensitive to the inductance of ground loops.

GROUND LOOP LOCATOR

PRIORITY CLAIM

The present invention claims the benefit of priority of U.S. Provisional Application No. 60/901571, filed on Feb. 13, 2007, entitled "Ground loop locator."

GOVERNMENT RIGHTS

The U.S. Government has certain rights in this invention pursuant to Grant No. DE-FG02-04ER54755/T-103336 awarded by DOE.

BACKGROUND (1) Field

The field of the present invention relates to devices and methods for detecting ground loops, more particularly to the field of devices and methods for detecting ground loops using hand-held, portable exciters and receivers, and still more particularly to devices and methods for detecting ground loops using hand-held, portable AC exciters and receivers that are sensitive to the inductance of ground loops.

(2) Related Art

Ground loops occur when electrical or electronic equipment are interconnected so as to develop unwanted paths to ground. There are many reasons for the existence of ground loops; they might be due to an accidental connection to ground (ground fault) or may be due to an inadvertent shortcoming of the system design. Regardless of the cause of ground loops, currents can flow in these loops, resulting in spurious, unwanted, and often confusing signals; these signals due to ground loops interfere with low-level signals typical of laboratory environments and instruments. In extreme situations, currents flowing in ground loops can even be dangerous, damaging equipment and endangering personnel.

Ground loops are not only a problem in research laboratories but also in the video and audio recording industries, temperature and humidity sensors used in building automation, medical diagnostics, and in the home where interconnected audio/video systems are notorious for producing ground loops.

Ground loops are especially hazardous in pulsed-power systems, such as plasma and fusion experiments, because the large and rapidly changing stray magnetic fields in these systems can induce enormous transient voltages. In addition, ground loops in pulsed-power systems are notoriously hard to find because of the transient nature of the pulsed magnetic fields.

Locating ground loops is conventionally accomplished by disconnecting suspect cables until the ground loop disappears. This diagnostic method can be tedious if there are large numbers of cables and becomes impractical if more than one ground loop exists because, in such a case, disconnecting any single cable will not reveal the ground loop. In the situation of multiple ground loops, all cables would have to be removed and then reconnected one-by-one until a ground loop appears. Obviously, disconnecting large numbers of cables tends to disable equipment, making it difficult to simultaneously generate a ground loop and search for it. In complex situations, the ground loop might never be found.

Compounding matters, the complexity and topology of ground loops may vary with the frequency of the signals flowing in them. At low frequencies, small resistances of cables tend to be responsible for ground loops, whereas, at high frequencies, it is the impedance of cables that tend to be responsible for ground loops. Thus, any system that searches for the existence of ground loops must do so at a frequency similar to that of the signals flowing in the system.

Information relevant to attempts to address these problems can be found in references Ref. 1 through Ref. 7, cited below. However, each one of these references suffers from one or more of the following disadvantages: requiring physical, invasive contact to circuits, such as soldering or clipping; operating at a frequency which is too low to measure the inductive impedance and thus the size of ground loops; lack of portability or incapable of being "hand-held"; requiring computers or complicated algorithms to operate; consuming too much power to be battery-operated; using large amounts of high-permeability magnetic materials, requiring increase costs; being quite large, further increasing costs; lacking a "binary" response to ground loops; and overcoupling the detector to ground loops, which tends to change the circuit under test. For the foregoing reasons, there is a need for a ground loop locator that: has a non-perturbative probe; operates at high frequencies where the impedance of a ground loop is highly inductive, giving an indication of the physical size of ground loops; is hand-held and portable; can be easily operated and read; consumes a low enough amount of power that it can be battery-operated; is inexpensive; is small; has a "binary" response to ground loops; and probes ground loops without changing their properties.

(3) LIST OF CITED REFERENCES

Ref. 1 —A. de la Pena, F. Lapayese, L. Pacios, and R. Carrasco. *Web-based ground loop supervision system for the TJ-II Stellerator. Fusion Engineering and Design*, Vol. 74, pp. 605-609, November 2005.

Ref. 2 —F. Bellina, G. Chitarin, M. Guarnieri, A. Stella, and F. Trevisan. *Earth Faults During RFX Initial Operations. Fusion Engineering*, 1993, 15$^{th}$ IEEE/NPSS Symposium On, Vol. 1, pp. 345-348, October 1993.

Ref. 3 —K. Zunino, P. Cara, P. Fejoz, J. Hourtoule, T. Loarer, N. Pomaro, A. Santagiustina, P. Spuig, and F. Villecroze. *The groundfault detection system for the Tore Supra toroidal pump limiter. Fusion Engineering and Design*, Vol. 66-68, pp. 1019-1023, September 2003.

Ref. 4—U.S. Pat. No. 4,075,675, Burkett et al. Ground Conductor Monitoring System and Method. Issued Feb. 21, 1978.

Ref. 5—Suretest® Circuit Tracers Instruction Manual. Datasheet/Instruction Manual [online]. Ideal Industries, Inc. [retrieved on 2007-12-10]. Retrieved from the internet: <URL: http://www.idealindustries.com/media/pdfs/products/suretest_circuit_tracers_instructions.pdf>.

Ref. 6—Fluke 1630 Earth Ground Clamp Meter datasheet. Datasheet/Instruction Manual [online]. Fluke Corporation, 2006 [retrieved on 2007-12-10]. Retrieved from the internet: <URL: http://support.fluke.com/find_it.asp?Document=2791074&src=www&cms_site=usen&cms_path=products,%20fluke%201630>.

Ref. 7—Fluke Saturn Geo X Advanced Three and Four Pole Earth Ground Tester datasheet. Datasheet/Instruction Manual [online]. Fluke Corporation, 2005 [retrieved on 2007-12-10]. Retrieved from the internet: <URL: http://support.fluke.com/find_it.asp?Document=10976&src=www&cms_site=usen&cms_path=products,%20moa>.

SUMMARY

The invention disclosed herein is a system that provides for rapid and accurate location of single or multiple ground loops. The system is non-contacting, does not require disconnecting any cables, and the equipment can be powered on while the ground loop is being located. The system operates at much higher frequencies than other ground loop locators, which reduces the size and cost. The system also facilitates a methodology for rapidly identifying which of a group of similar- or identical-looking cables is causing a ground loop. The system is sufficiently simple and inexpensive that it could be configured as a permanent addition to any electronic instrument to provide a warning whenever a ground loop becomes established, or one can have a hand-held, highly portable system for identifying ground loops.

In one aspect, the ground loop locator comprises an exciter portion. The exciter portion comprises an EMF generator. The EMF generator comprises an AC periodic signal generator containing an exciter frequency, and an amplifier containing an amplifier input and an amplifier output, the amplifier input conductively connected with the AC periodic signal generator. The exciter portion also comprises a current transformer conductively connected with the amplifier output of the EMF generator. The ground loop locator also comprises a detector portion. The detector portion comprises a Rogowski coil. The detector portion also comprises a filter containing a filter input and a filter output, the filter input conductively connected with the Rogowski coil, the filter approximately tuned such that a signal at the exciter frequency of the AC periodic signal generator arriving at the filter input is substantially transmitted to the filter output. The detector portion also comprises a readout connected with the filter output. Thus the readout indicates the presence of a ground loop when a ground loop exists in conductors linked by the current transformer of the exciter portion and the Rogowski coil of the detector portion.

In yet another aspect, the ground loop locator further comprises a housing, substantially housing the ground loop locator.

In yet another aspect, the ground loop locator further comprises an exciter housing substantially housing the exciter portion and a detector housing substantially housing the detector portion.

In yet another aspect, the exciter housing is detachably connected with the detector housing.

In yet another aspect, the filter further comprises a lock-in amplifier; the filter further comprises a phase-reference input; the AC periodic signal generator further comprises a phase reference output; and a phase reference link connects the phase reference output and the phase reference input. Thus, phase information from the phase reference output of the AC periodic signal generator of the exciter portion is coupled into the phase reference input and shared with the lock-in amplifier of the detector portion via the phase reference link.

In yet another aspect, the phase reference link is an electrical conductor.

In yet another aspect, the phase reference link is an optical fiber.

In yet another aspect, the phase reference link is a transmitter/receiver pair, wherein the transmitter is connected with the exciter portion and the receiver is connected with the detector portion.

In yet another aspect, the transmitter/receiver pair communicate with radiation substantially within the infrared portion of the electromagnetic spectrum.

In yet another aspect, the filter further comprises a filter amplifier having a filter amplifier gain.

In yet another aspect, the filter amplifier gain is adjustable, whereby the ground loop locator can be made more or less sensitive by adjusting the signal amplifier gain.

In yet another aspect, the Rogowski coil is openable.

In yet another aspect, the Rogowski coil comprises a first coil portion and a second coil portion, the first coil portion hingedly connected with the second coil portion, whereby the Rogowski coil can easily be wrapped around cables or groups of cables.

In yet another aspect, the Rogowski coil is flexible such that the Rogowski coil can be elastically deformed, whereby the Rogowski coil can be used while pressed against a surface.

In yet another aspect, the Rogowski coil has a hollow core.

In yet another aspect, the readout comprises: an approximately linear rectifier containing a rectifier input and a rectifier output, the rectifier input conductively connected with the filter output; an integrator containing an integrator input and an integrator output, the integrator input conductively connected with the rectifier output; and a display connected with the integrator output, the display providing a display output that is approximately proportional to voltages on the integrator output. Thus, the display provides an approximately proportional representation of the current flowing in ground loops detected by the ground loop locator.

In yet another aspect, the readout comprises: an approximately linear rectifier containing a rectifier input and a rectifier output, the rectifier input conductively connected with the filter output; and a display connected with the rectifier output, the display providing a display output that is approximately proportional to the average voltage on the rectifier output. Thus, the display provides an approximately proportional representation of the current flowing in ground loops detected by the ground loop locator.

In yet another aspect, the readout comprises: a comparator containing a comparator threshold; and an indicator. Thus, the indicator provides a binary representation of whether the current flowing in ground loops detected by the ground loop locator is above the comparator threshold.

In yet another aspect, the transformer is a split-core transformer, whereby the transformer can easily be wrapped around cables or groups of cables.

In yet another aspect, the exciter frequency of the AC periodic signal generator is greater than 5 kilohertz.

In yet another aspect, the ground loop locator further comprises a DC power source, whereby the ground loop locator operates using energy from the DC power source.

In yet another aspect, the DC power source is a battery.

In yet another aspect, the DC power source is an AC/DC converter, and the ground loop locator can be directly powered by AC power via the AC/DC converter.

In yet another aspect, the ground loop locator comprises an exciter portion. The exciter portion comprises an EMF generator. The EMF generator comprises an AC periodic signal generator containing an exciter frequency. The exciter portion also comprises a current transformer conductively connected with the AC periodic signal generator of the EMF generator. The ground loop locator also comprises a detector portion. The detector portion comprises a Rogowski coil. The detector portion also comprises a filter containing a filter input and a filter output, the filter input conductively connected with the Rogowski coil, the filter approximately tuned such that a signal at the exciter frequency of the AC periodic signal generator arriving at the filter input is substantially transmitted to the filter output. The detector portion also comprises a readout connected with the filter output. Thus the readout indicates the presence of a ground loop when a ground loop exists in conductors linked by the current transformer of the exciter portion and the Rogowski coil of the detector portion.

BRIEF DESCRIPTION OF THE DRAWINGS

The objects, features and advantages of the present invention will be apparent from the following detailed descriptions of the various aspects of the invention in conjunction with reference to the following drawings, where.

Appendix A is an article by Paul M. Bellan, entitled, *Simple system for locating ground loops*, published in *Review of Scientific Instruments*, Volume 78, as article number 065104, in June, 2007.

DETAILED DESCRIPTION

The present invention relates to devices and methods for detecting ground loops, more particularly to the field of devices and methods for detecting ground loops using hand-held, portable exciters and receivers, and still more particularly to devices and methods for detecting ground loops using hand-held, portable AC exciters and receivers that are sensitive to the inductance of ground loops. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

(1) Glossary

Before describing the specific details of the present invention, a glossary is provided in which various terms used herein and in the claims are defined. The glossary provided is intended to provide the reader with a general understanding of the intended meaning of the terms, but is not intended to convey the entire scope of each term. Rather, the glossary is intended to supplement the rest of the specification in more accurately explaining the terms used.

Rogowski Coil—The term "Rogowski coil" as used with respect to this invention refers to any multi-turn coil that wraps around a current-carrying conductor with turns oriented to link magnetic field produced by a straight wire. The turns are substantially uniform in pitch along the coil axis such that the Rogowski coil is not sensitive to current carrying conductors not linked by the Rogowski coil.

Openable Rogowski Coil—The term "openable Rogowski coil" as used with respect to this invention refers to a Rogowski coil that is split, such that the coil has two ends and where the wire on one end is brought back along the axis of the coil to be adjacent to the wire on the other end of the coil such that both wires come out of the same end, allowing one end of the coil to be opened.

(2) Specific Aspects

Figure 1:
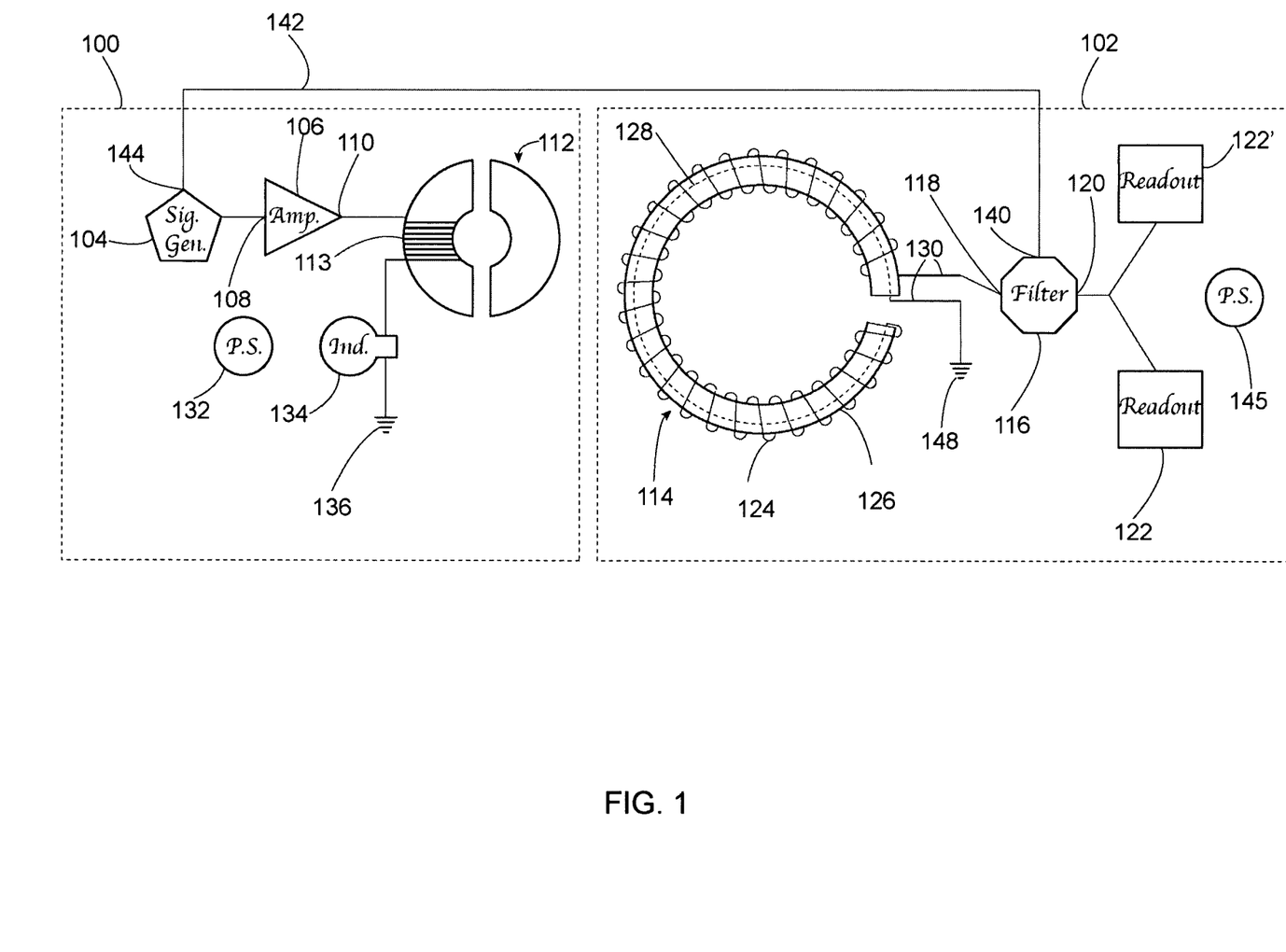
FIG. 1 is a schematic of one possible embodiment of the invention.

FIG. 1 is a schematic of one possible embodiment of the invention. The invention is comprised of two portions, an exciter portion 100 and a detector portion 102. The exciter portion 100 induces a high-frequency EMF in conductors of test circuits; the current driven by the EMF induced by the exciter portion 100 in test circuits is detected by the detector portion 102 when a loop exists in a conductor of test circuits linked by both the exciter portion 100 and the detector portion 102. Thus, the detector portion 102 can identify which circuit is conducting the current driven by the EMF induced by the exciter portion 100.

In its most basic configuration, the exciter portion 100 comprises an AC periodic signal generator 104; an amplifier 106 containing an amplifier input 108 and an amplifier output 110; and a current transformer 112.

The AC periodic signal generator 104 and amplifier 106 together comprise an EMF generator. As can be appreciated by one of ordinary skill in the art, the EMF generator can be comprised of two separate components, as illustrated in FIG. 1, or the AC periodic signal generator 104 and amplifier 106 can be combined into a single unit. For instance, if the AC periodic signal generator produces substantially enough power such that the detector portion 102 can detect ground loops without the amplifier 106, then no amplifier may be needed or the amplifier 106 may have a gain substantially equal to unity. One of ordinary skill in the art can appreciate that AC signals can be generated by a multitude of simple circuits, non-limiting examples of which are integrated circuit frequency generators such as the LM555C manufactured by National Semiconductor of Santa Clara, Calif.; RLC resonant circuits in combination with operational amplifiers; crystal oscillators; voltage-controlled oscillators; and function generators. In addition, the precise waveform generated by the AC periodic signal generator is not critical; any waveform, non-limiting examples of which are square, rectangle, sawtooth, sinusoid, with the same fundamental frequency has substantially the same effect when operating the invention. The amplifier 106 can be any amplifier that can amplify signals at the frequency generated by the AC periodic signal generator 104 such that the detector portion 102 can detect the current driven by the induced EMF in test circuits when ground loops exist; non-limiting examples of classes of suitable amplifiers are bipolar junction transistors such as the 2N2222 bipolar transistor, field effect transistors, metal on silicon field effect transistors, operational amplifiers, and vacuum tube amplifiers. The AC periodic signal generator outputs an AC periodic signal into the amplifier input 108; the AC periodic signal is then amplified by the amplifier 106 and output at the amplifier output 110. The amplifier output 110 is conductively connected with the current transformer 112; thus the EMF generator generates an AC EMF in the current transformer 112.

The current transformer 112 can be a split-core transformer with several turns of wire comprising the current transformer windings 113. The core of the current transformer 112 comprises a high permeability magnetic material, a non-limiting example of which is ferrite, iron, cobalt, or nickel. A typical, non-limiting example of the number of turns of the current transformer windings 113 is eight turns. A split-core, clampable current transformer, a non-limiting example of which is eight turns of wire wound on the ferrite split core model 28A4155-0A2, manufactured by Steward of Chattanooga, Tenn., allows for portability and allows one to impose an EMF in test circuits without making physical contact, disconnecting components, or altering test circuits in any way. Moreover, having a clampable current transformer greatly reduces the time necessary to bind to test circuits, which might otherwise be done by physically binding by, for example, soldering or clipping, which further require removing any insulation that exists on test circuit wiring. As can be appreciated by one of ordinary skill in the art, for a given sensitivity, the ratio of the amount of high permeability magnetic material necessary for a given magnetic flux swing in the material is constant. Thus by increasing the frequency of the induced EMF, one can increase the rate of change of magnetic flux and hence the magnitude of the EMF and so reduce the amount of high permeability magnetic material necessary to achieve a given sensitivity; this can be an advantageous trade-off since the cost of high permeability magnetic material far exceeds the cost of high-frequency circuitry for frequencies approximately in the tens of kilohertz to hundreds of kilohertz regime.

In addition to the components described above, the exciter portion 100 can additionally comprise many other useful features. An exciter portion power supply 132, non-limiting examples of which can be a DC power supply, an AC/DC converter, or a battery, provides power for the AC periodic signal generator 104 and the amplifier 106. The exciter portion power supply 132 can be toggled from on to off by including a toggle or switch, which could be controlled either mechanically by a user or electrically by a computer or external circuitry. An exciter portion indicator 134 can indicate when the exciter portion 100 is on and thus generating an EMF in the current transformer 112. The exciter portion indicator 134 can be placed anywhere in the circuit such that there is a significant change in the current at the position of or voltage across the exciter portion indicator 134 when the exciter portion 100 is on. A non-limiting example of the position of the exciter portion indicator 134 is after the current transformer 112, as illustrated in FIG. 1; in this configuration, a significant current flows through the exciter portion indicator 134 when the exciter portion 100 is on, and approximately no current should flow through the exciter portion indicator 134 when the exciter portion 100 is off. The exciter portion indicator 134 can be any indicator that provides a binary output capable of indicating that the exciter portion 100 is on; non-limiting examples of suitable indicators are light-producing indicators such as incandescent bulbs or light-emitting diodes; sound-producing indicators such as speakers, which may require circuitry to convert the AC EMF frequency to be converted to an audible frequency; or even integrated circuits that send a signal to a computer, the computer then providing the indication through its audible or visual outputs or recording the change in the state of the exciter portion power supply (from on to off or vice-versa) as data. In addition, the exciter portion indicator 134 may draw power derived from the amplifier 106 (as shown in FIG. 1), or it may draw power from the exciter portion power supply 132. The amplifier 106 can additionally have adjustable gain; this allows for the possibility of saving power when smaller EMFs from the current transformer 112 produce sufficiently large responses in the detector portion 102. The gain of the amplifier 106 can be adjusted by a myriad of methods, non-limiting examples of which are potentiometers, variable capacitors, variable inductors, analog voltage-controlled integrated circuits or digital voltage-controlled integrated circuits. An exciter common voltage reference 136 can also be included in the invention; non-limiting examples of common voltage references can be provided by earth ground, local metal ground such as shielding or casing, Zener diodes, and "bandgap" devices.

Finally, one of ordinary skill in the art can appreciate that various exciter portion connections must be made between components of the exciter portion 100 for the device to function. In addition, power must be delivered from the exciter portion power supply 132 and some components of the exciter portion 100; the arrangement of power supply leads has not been shown in FIG. 1 but should be obvious to one of ordinary skill and are additionally demonstrated concretely in FIG. 2A.

In its most basic configuration, the detector portion 102 comprises a Rogowski coil 114; a filter 116 containing a filter input 118 and a filter output 120; and a readout 122.

The Rogowski coil 114 comprises an approximately toroidal coil-form 124 with a multitude of windings 126 of wire 128, the wire 128 having leads 130. The windings 126 of wire 128 are made from suitable magnet wire, such as aluminum or copper with thin insulation; however, as one of ordinary skill in the art can appreciate, any conducting wire will serve the same purpose and can be used without requiring extensive reengineering of the system. The coil-form 124 can be made from flexible tubing, such as soft plastic or rubber, or rigid materials such as metal tubing slotted in the long direction or hard plastics. If the coil-form 124 is hollow, the wire 126 can make a return path within the coil-form 124, as shown in FIG. 1; this is a simple way to force the leads 130 to enter and exit the Rogowski coil 114 at the same end, making it easy to link the Rogowski coil 114 to cables or series of cables by wrapping the Rogowski coil 114 around the cables or series of cables without disturbing or disconnecting the cables or series of cables. As a non-limiting example, 370 turns of 22 gauge magnet wire can be wound with approximately 12.3 turns per centimeter around a ⅜ inch diameter flexible plastic tubing, which can then be bent into a 10 centimeter diameter torus with circular cross-section. For the example given above (370 turns of 22 gauge magnet wire wound with approximately 12.3 turns per centimeter around a ⅜ inch diameter flexible plastic tubing, bent into a 10 centimeter diameter torus), when the Rogowski coil 114 links a 30 milliamp (peak-to-peak) AC test current with frequency 100 kilohertz, the Rogowski coil 114 provides a voltage across its leads 130 of $V_{Rog}=N'\pi a^2\mu_0\omega I=2$ millivolts, where $V_{Rog}$ is the voltage (EMF) generated in the Rogowski coil, N' is the turns per meter, $a^2$ is the minor radius in meters, $\mu_0$ is the permeability of vacuum, $\omega$ is the angular frequency in radians per second, and I is the current. One of ordinary skill in the art can appreciate that $V_{Rog}$ in the above example is large enough for convenient use with low-cost operational amplifiers. The relatively high (100 kilohertz) operating frequency is used since the proportionality of the output voltage of the Rogowski coil 114 to frequency makes the device increasingly sensitive at high frequencies without changing the physical parameters of the Rogowski coil 114.

The function of the Rogowski coil 114 can be easily understood by one of ordinary skill in the art by applying the integral form of Ampere's law to a system in which a test current passes through the Rogowski coil 114; i.e. $\oint_C \vec{B} \cdot \vec{dl} = \mu_0 I$, where the vector B is the magnetic field, the vector $\vec{dl}$ is the differential length along the contour C, and the contour C is the axis around which the turns of the Rogowski coil 114 are individually wound. The integral formulation of Ampere's law shows that the flux intercepted by the Rogowski coil is independent of the contour C. For the Rogowski coil 114, this means that the shape of the coil-form 124 does not matter provided that the windings 126 are substantially uniformly spaced along the contour C so that the turns per length is approximately constant along the contour C. Thus, the Rogowski coil 114 can be non-concentric with linked cables, squeezed into tight locations, and deformed to be noncircular, all without changing the calibration or sensitivity of the Rogowski coil 114.

In addition, the integral form of Ampere's law applied to the Rogowski coil 114 shows that the Rogowski coil 114 provides a substantially binary response to test currents; i.e. if a test conductor carries current through the Rogowski coil, then the voltage across the leads 130 is the same no matter how the current is carried through (i.e. non-concentrically, at non-normal incidence, non-rectilinearly), but if the test conductor does not carry the current through the Rogowski coil 114, then the voltage across the leads 130 is zero, regardless of how close the test conductor is to the Rogowski coil 114, the amount of current being carried by the test conductor, or the relative orientation of the test conductor to the Rogowski coil 114. This is a significant benefit over any ground loop locator whose detector coil does not link the test current. Such a ground loop locator would instead rely on the detector coil voltage's dependence on the proximity to the ground loop and the voltage on the detector coil would depend on the relative orientation of the test current to the detector coil, as would be the response, for example, of a solenoid or single loop of wire.

It is the job of the filter 116 to convert the AC periodic voltage at the filter input 118 induced in the Rogowski Coil 114 into whatever form is required at the filter output 120 by the readout 122. Thus, the filter may comprise any combination of: a voltage divider; a sufficiently narrow bandpass or edgepass filter that passes the frequency of the AC periodic signal generator 104, non-limiting examples of which are LRC circuits, lumped circuit filters, or integrated circuit filters, the filter possibly being tunable if the AC periodic signal generator 104 is also tunable; an AC/DC converter, such as a linear rectifier or integrated circuit AC/DC converter; a filter amplifier to boost the signal, possibly with the filter amplifier having adjustable gain; an integrator; a differentiator; or a comparator with a reference voltage to indicate when the voltage at the filter input 118 is above or below the reference voltage, the reference voltage may be tunable. In addition, the filter 116 may comprise a lock-in amplifier, which provides exquisite sensitivity for weak periodic signals. If the filter 116 comprises a lock-in amplifier, then the filter 116 must have a phase reference input 140. The phase reference input 140 must be supplied with phase information from the exciter portion 100, such as from the AC periodic signal generator 104. Thus there must be a phase reference link 142 that provides phase information from some portion of the exciter portion 100 that carries the AC periodic signal generated by the AC periodic signal generator 104. In FIG. 1, the link goes directly from the AC periodic signal generator 104 to the phase reference input 140. This can be done with a separate phase reference output 144 as shown in FIG. 1 or by using the signal on the amplifier input 108. The phase reference link 142 may be a physical link, non-limiting examples of which are wire; cables such as coaxial; universal serial bus (USB), and serial cables; and optical fibers. Alternatively, the phase reference link 142 may be a remote link comprising a transmitter that transmits signals derived from the AC periodic signal generator 104 or some other suitable component of the exciter portion 100 and a receiver connected with the phase reference input 140 of the detector portion 102. Infrared radiation is particularly useful for such remote links, such as those in remote controls for televisions. Alternatively, encoded radio- or microwave-frequency radiation may be used to establish the remote link, enabling the device to use communication protocols such as "Bluetooth." A lock-in amplifier must also have some form of adjustable delay line; this may be done by varying the length of the phase reference link 142 (in the case of cables or wires), by having a separate phase shifting element before the filter 116; or by having a phase shifting element internal to the filter 116. It should be obvious to one of skill in the art that there may also be various inputs on a lock-in amplifier to set integration times, duty cycles, and many other user-defined settings to optimize the sensitivity of the lock-in amplifier. Although the filter 116 in FIG. 1 is shown as having only one filter output 120, one of ordinary skill in the art will understand that the filter 116 can have multiple outputs, which may be necessary if more than one type of readout 122 is used; thus, the filter 116 may comprise many independent filter types and filter outputs to accommodate multiple readout types.

At least one readout 122 is connected with the filter output. The readout 122 may be anything that indicates whether a ground loop is linked by the current transformer 112 of the exciter portion 100 and the Rogowski coil 114 of the detector portion 102. As one non-limiting example, the readout may be a voltmeter, digital or analog, that measures the voltage at the filter output 120, which may be proportional to the voltage across the leads 130 of the Rogowski coil 114. This voltage may be filtered, amplified, rectified, or otherwise manipulated by the filter; so one of ordinary skill in the art will immediately realize that such a voltmeter may need to be calibrated. However, one of ordinary skill should also realize that calibration may not be necessary at all; any voltage at the filter output 120 that is approximately proportional to the voltage across the leads 130 of the Rogowski coil 114 will be an excellent indicator of the presence of ground loops, irrespective of whether the instrument has been calibrated. The readout may contain a display and microprocessor to convert the measured voltage to a digital display and show the value of the measured voltage; non-limiting examples of such displays are LED indicators. The readout may also contain an analog display of the voltage. The readout 122 may also be an indicator of the voltage, providing sound or light in proportion to the size of the ground loop. Alternatively, the readout 122 may comprise a comparator and an indicator, the indicator then indicating only when the voltage at the filter output 120 is above some threshold determined by the comparator; the threshold may be adjustable to look for ground loops smaller than the impedance determined by the threshold. The readout 122 may itself contain an approximately linear rectifier or an integrator to manipulate the signal at the filter output 120. One of ordinary skill in the art can appreciate that some circuit components and even the human eye naturally integrate AC signals without an explicit integrator by having a substantially slow response; thus, signals may be integrated without the presence of a formal integrator. The readout 122 could also record information on a recordable and computer-readable media or send information directly to a microprocessor or computer. As shown in FIG. 1 and mentioned above, there may be multiple readouts 122 and 122'.

In addition to the components described above, the detector portion 102 can additionally comprise many other useful features. A detector portion power supply 145, non-limiting examples of which can be a DC power supply, an AC/DC converter, or a battery, provides power for the filter 116 and readout 122. The detector portion power supply 145 can be toggled from on to off by including a toggle or switch, which could be controlled either mechanically by a user or electrically by a computer or external circuitry. A detector portion indicator (not shown in figures) can indicate when the detector portion 102 is on and thus ready to detect the test currents induced in the Rogowski coil 114 injected by the current transformer 112 into test circuits that have a ground loop. The detector portion indicator can be any indicator that provides a binary output capable of indicating that the detector portion 102 is on; non-limiting examples of suitable indicators are light-producing indicators such as incandescent bulbs or light-emitting diodes; sound-producing indicators such as speakers, which may require circuitry to convert the AC EMF frequency to be converted to an audible frequency; or even integrated circuits that send a signal to a computer, the computer then providing the indication through its audible or visual outputs or recording the change in the state of the exciter portion power supply (from on to off or vice-versa) as data. A detector common voltage reference 148 can also be included in the invention; non-limiting examples of common voltage references can be provided by earth ground, local metal ground such as shielding or casing, Zener diodes, and "bandgap" devices.

Finally, one of ordinary skill in the art can appreciate that various detector portion connections must be made between components of the detector portion 102 for the device to function. In addition, power must be delivered from the detector portion power supply 145 and some components of the detector portion 102; the arrangement of power supply leads has not been shown in FIG. 1 but should be obvious to one of ordinary skill and are additionally demonstrated concretely in FIG. 2B.

Figure 2A:
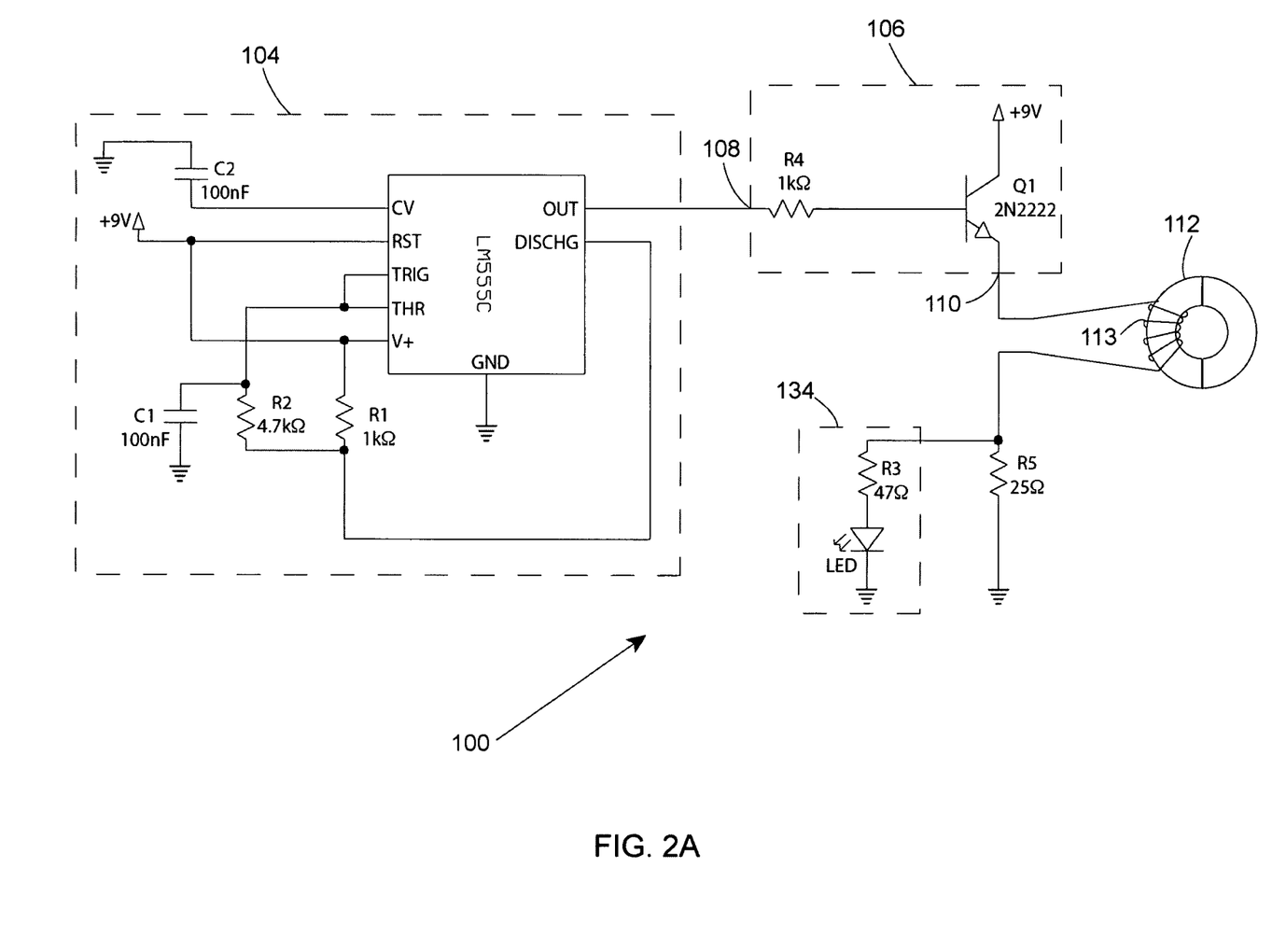
FIG. 2A is a schematic of one possible embodiment of the exciter portion, including a non-limiting, exemplary circuit diagram.

FIG. 2A shows a non-limiting example of a specific embodiment of the exciter portion 100. Here the AC periodic signal generator 104 comprises an LM555C function generator integrated circuit; resistors R1 and R2; capacitors C1 and C2; a voltage referenced to the exciter portion power supply 132 (+9V); and various voltages referenced to the exciter portion common voltage reference 136. For the parameters shown in FIG. 2A, the AC periodic signal generator generates a substantially square waveform with a fundamental frequency of approximately 100 kHz. The amplifier 106 comprises a 2N2222 transistor; resistor R4; and a voltage referenced to the exciter portion power supply 132 (+9V). The exciter portion indicator 134 comprises an LED and resistor R3. One of ordinary skill in the art will appreciate that the type and number of the circuit components and the values of the components are just part of this particular exemplary embodiment of the invention; the invention is not limited thereto and is to be afforded the widest scope possible.

Figure 2B:
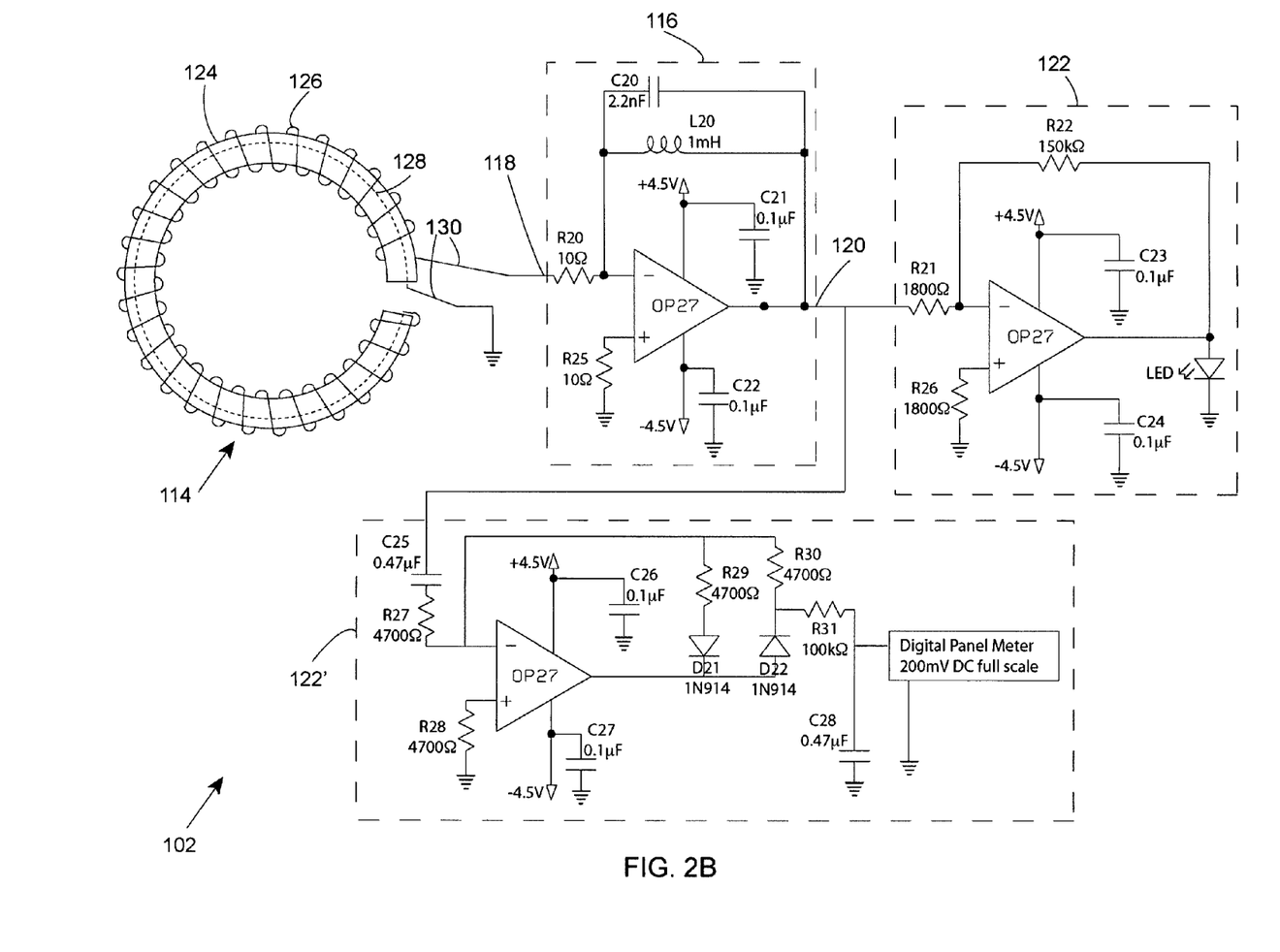
FIG. 2B is a schematic of one possible embodiment of the detector portion, including a non-limiting, exemplary circuit diagram.

FIG. 2B shows a non-limiting example of a specific embodiment of the detector portion 102. The filter 116 comprises an OP27 operational amplifier, manufactured by Analog Devices of Norwood, Mass.; resistors R20 and R25; capacitors C20, C21, and C22; inductor L20; and voltage references to the detector portion power supply 145 (±4.5V) and detector portion common voltage reference 148. In this case, the filter 116 provides amplification, with peak amplification at approximately 100 kilohertz to match the approximately 100 kilohertz square wave generated by the AC periodic signal generator 104 of FIG. 2A. The input impedance of the filter 116 (10 ohms) is so low that the system is essentially immune to electrostatic pickup; i.e. there is negligible capacitively coupled spurious electrostatic signal as would be the case for a system with a high input impedance. The filter output 120 is conductively connected with readouts 122 and 122'. Readout 122 is an indicator, comprising an untuned, high-gain OP27 operational amplifier driving an LED. Since the Rogowski coil only gives a signal when it links an AC current, the LED illuminates only if the Rogowski coil is wrapped around a wire conducting the 100 kilohertz test current induced by the current transformer 112. Readout 122 also comprises resistors R21, R22, and R26; capacitors C23 and C24; and voltage references to the detector portion power supply 145 (±4.5V) and detector portion common voltage reference 148. Readout 122' is shown in FIG. 2B as a digital voltmeter that reads a rectified voltage, the DC component of which is proportional to the amplitude of the voltage at the filter output 120 and thus proportional to the voltage difference across the leads 130 of the Rogowski coil 114. The readout 122' comprises an OP27 operational amplifier; resistors R27, R28, R29, R30, and R31; capacitors C25, C26, C27, and C28; a digital panel meter; 1N914 diodes D21 and D22, manufactured by Micro Commercial Components of Chatsworth, Calif.; and voltage references to the detector portion power supply 145 (±4.5V) and detector portion common voltage reference 148. The digital panel meter provides an indication of the relative magnitude of the ground loop current linked by the Rogowski coil 115 and current transformer 112. Because diodes have a nominal 300-400 millivolt drop, simple diode rectification of the approximately 100 kilohertz AC signal does not result in a linearly proportional DC signal. In order to obtain a DC signal that is linearly proportional to the AC signal, two oppositely oriented diodes, D21 and D22, are used in series with two feedback resistors, R29 and R30, respectively. Positive feedback current flows through one diode-resistor pair, while negative feedback current flows through the other. Because the operational amplifier adjusts its output voltage to maintain a feedback current equal to its input current, the amplifier output voltage will assume whatever value is required to accommodate the diode voltage drop and so will not be linearly proportional to the AC voltage at the input to the operational amplifier. However, the feedback current is linearly proportional to the input voltage and input current. Thus, by measuring the voltage across one of the feedback resistors (R30 in FIG. 2B), a DC signal which is linearly proportional to the amplitude of the AC input is obtained. Because one end of the feedback resistor is at virtual ground, the measurement can be between true ground and the junction between the resistor R30 and diode D22. The digital panel meter indicates the relative severity of the ground loop and possible subdivisions of the ground loop current into multiple paths.

Figure 3A:
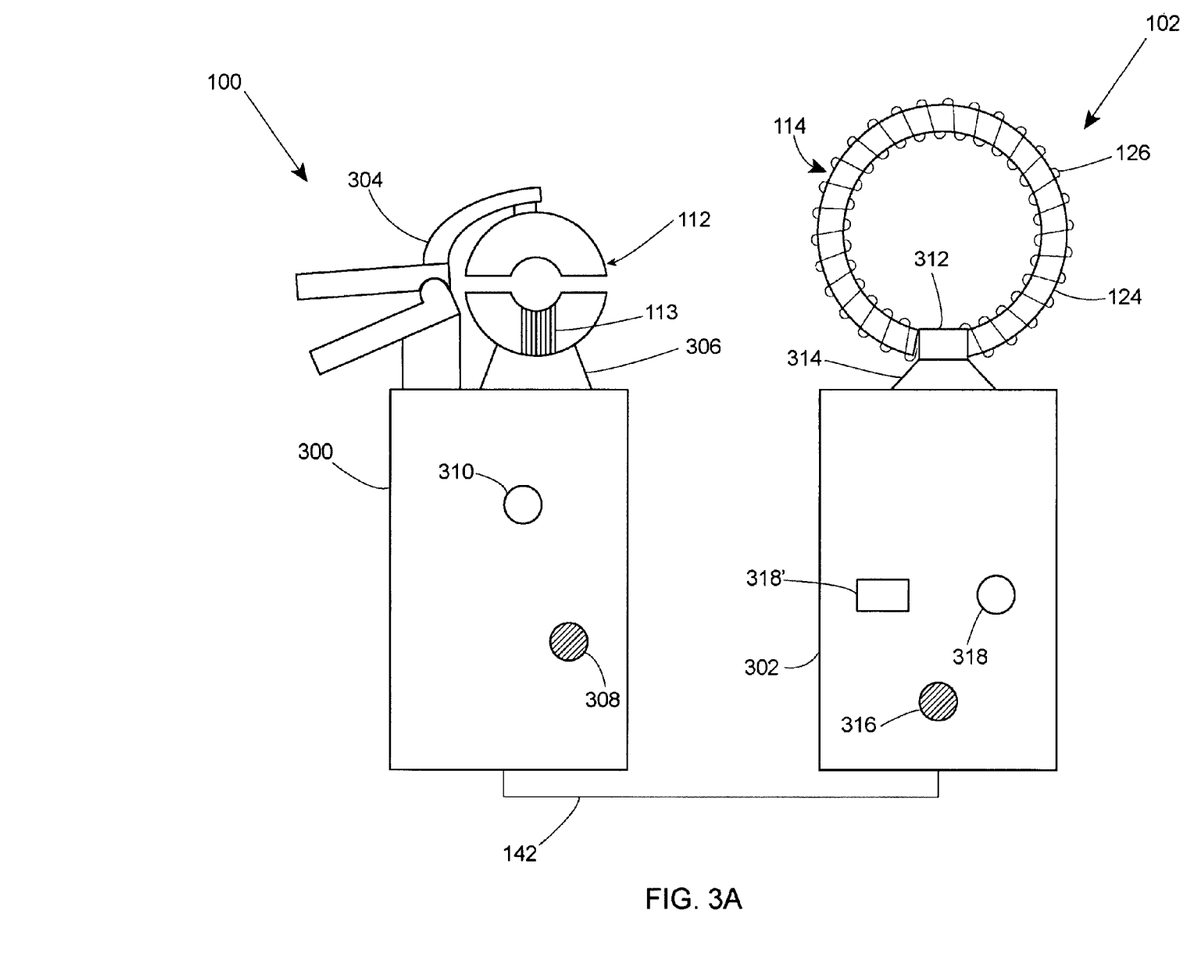
FIG. 3A is an illustration of a particular embodiment of the invention, wherein the exciter portion 100 is housed by an exciter housing 300, and the detector portion 102 is housed by a detector housing 302.

FIG. 3A is an illustration of a particular embodiment of the invention, wherein the exciter portion 100 is housed by an exciter housing 300, and the detector portion 102 is housed by a detector housing 302. The current transformer 112 is split, and one half is attached with a transformer clamp 304, while the other half is attached with a transformer mount 306. The transformer clamp 304 allows the current transformer 112 to be coupled to test cables without physically contacting them by clamping around and inductively coupling to them. An exciter portion power toggle switch 308 toggles the exciter portion power supply 132 (not shown in FIG. 3A) from on to off and vice-versa. An exciter portion indicator window 310 allows access to the exciter portion indicator 134 (not shown in FIG. 3A) from outside the exciter housing 300. The Rogowski coil 114 is held closed by a retainer 312. In FIG. 3A, one end of the Rogowski coil 114 is inserted into the retainer 312; this is the end from which the wires protrude into the detector housing 302 and it is rigidly attached inside the retainer 312. The other end of the Rogowski coil 114 is free; this facilitates wrapping the Rogowski coil 114 around test cables to check for ground loops. Once test cables are inserted into the Rogowski coil 114, the free end of the Rogowski coil 114 can be inserted into the retainer 312, creating a loop with the Rogowski coil 114 wrapped around the test cables. The retainer 312 is attached with a Rogowski coil mount 314, the Rogowski coil mount further being attached with the detector housing 302. A detector portion power toggle switch 316 toggles the exciter portion power supply 145 (not shown in FIG. 3A) from on to off and vice-versa. Detector portion indicator windows 318 and 318' allow access to the detector portion indicators 122 and 122', respectively (not shown in FIG. 3A) from outside the detector housing 302.

Figure 3B:
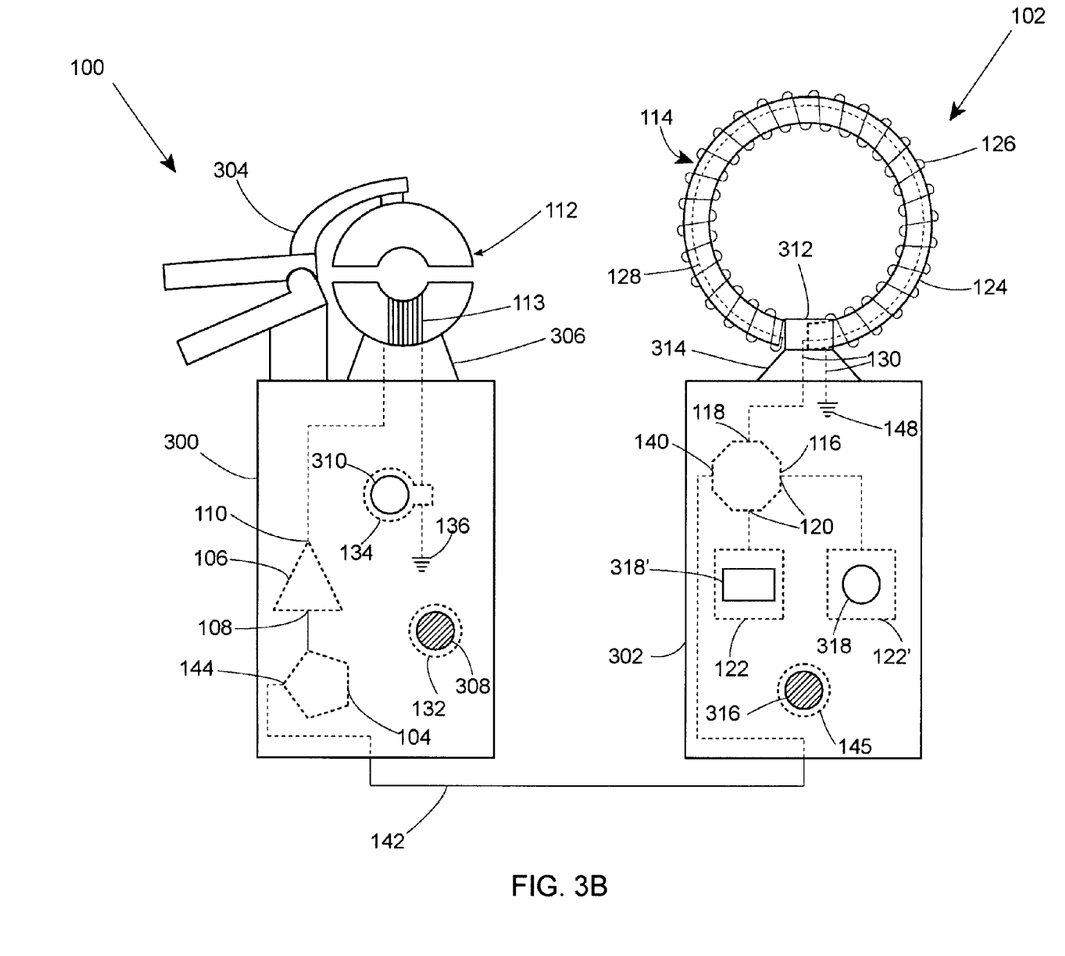
FIG. 3B is a partially cut-away illustration of FIG. 3A.

FIG. 3B is a partially cut-away illustration of FIG. 3A, wherein the exciter housing 300 and the detector housing 302 are cut away so that the circuit components can be seen within. Transformer mount 306 is also cut away to allow one to see how the current transformer windings 113 enter the exciter housing 300. Additionally, the retainer 312 is cut away to reveal how the Rogowski coil 114 is inserted into the retainer 312. Finally, the Rogowski coil mount 314 is cut away to reveal how the leads 130 enter the detector housing 302.

One of ordinary skill in the art can appreciate that, although FIG. 3A and FIG. 3B illustrate the invention as being housed in separate exciter housing 300 and detector housing 302, it would be a simple matter to house the invention in a single housing. In addition, by winding the wires that make up the current transformer windings 113 onto a spool that is housed within the exciter housing 300, the current transformer 112 can be deployed and retracted from the exciter housing 300. The lead wires 130 of the Rogowski coil 114 can similarly be wound on a spool, allowing the Rogowski coil 114 to be deployed and retracted from the detector housing 302. In either case, the spool can be connected with a handle for spooling and unspooling wire, such as a garden hose spool, or the spool can have a tendency to retract itself, such as a tape measure.

Figure 4:
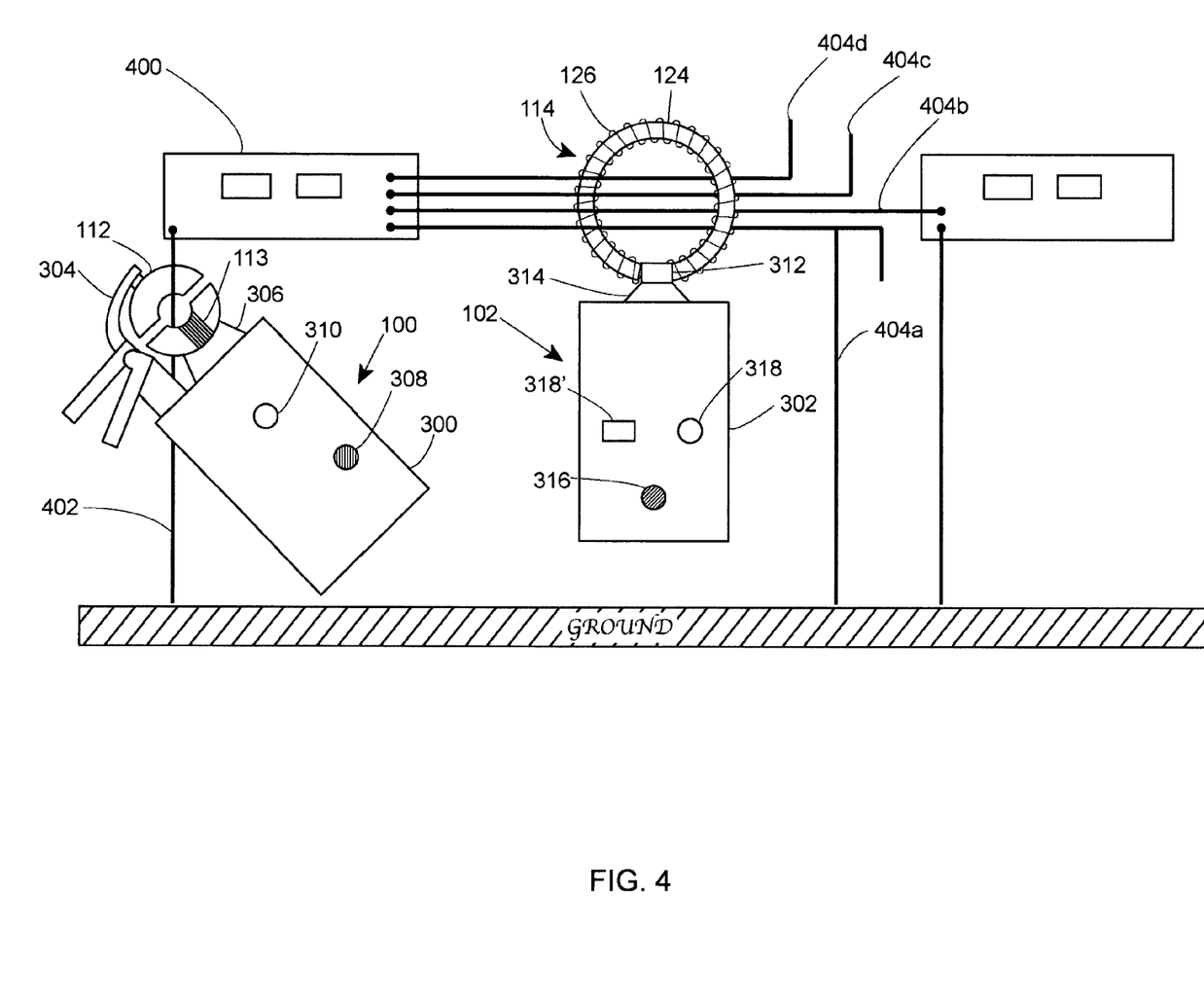
FIG. 4 illustrates a method of using the invention to find ground loops.

FIG. 4 illustrates a method of using the invention to find ground loops. The current transformer's high-permeability material split core is placed around the first instrument power cable 402, the first instrument power cable 402 also comprising a ground wire in addition to power wires. If a ground loop exists, the exciter induces a test current in the ground line of the first instrument 400. The existence of a ground loop is established by wrapping the Rogowski coil 114 around the first instrument power cable 402 as well. With both the exciter portion 100 and detector portion 102 turned on, the readout 122 will indicate the existence of any ground loop; however, at this stage, the location (i.e. the identity of the cables comprising the ground loop circuit) is unknown. Specific ground loops are then located by wrapping the Rogowski coil 114 around groups of cables or individual cables connected to the first instrument 402. If the readout 122 indicates the existence of a ground loop, then the wrapped cable or cables are part of a ground loop. In FIG. 4, wrapping the Rogowski coil 114 around cables 404 (it is to be understood that 404 refers to 404a, 404b, 404c, and 404d, collectively) yields a positive indication from the readout 122 that at least one of the cables 404 is part of a ground loop. If the Rogowski coil 114 were wrapped around only cables 404c and 404d, there would be no indication of a ground loop from the readout 122, which would show that cables 404c and 404d are not part of a ground loop. Cable subgroups that do not illuminate the LED (i.e. 404c and 404d in FIG. 4) are then removed from the Rogowski coil 114. The procedure of removing cable subgroups is repeated until offending cables are isolated (i.e. cables 404a and 404b in FIG. 4). Absolute proof that any particular cable is part of a ground loop is established when the readout 122 positively indicates the existence of a ground loop when the Rogowski coil is wrapped around that cable alone. By this method, it was found in an actual laboratory setting that the identity of a single offending cable could be determined in about 2 minutes when this cable was one of a bundle of about 90 visibly indistinguishable cables. This is to be contrasted with the conventional procedure of documenting how all cables in the bundle are connected, disconnecting them all, and then reconnecting them one by one until "evidence" (for example, a particular noise signature) of the ground loop reappeared in the instrumentation. This conventional procedure would not just be tedious but might also be impractical because the system might become inoperable as cables are disconnected, eliminating the possibility of observing the "evidence" when the ground loop is reconnected. If the instrument being tested is isolated from ground, a temporary wire can be connected from the chassis of the instrument being tested to ground; the exciter can then be used to drive the test current in this temporary wire.

Appendix A is an article authored by Paul M. Bellan, entitled *Simple system for locating ground loops*, published in *Review of Scientific Instruments*, Volume 78, as article number 065104, in June, 2007. The article describes various aspects and embodiments of the invention disclosed herein.

As can be appreciated by one skilled in the art, although the above description utilized many specific measurements and parameters, the invention is not limited thereto and is to be afforded the widest scope possible.

What is claimed is:

1. A ground loop locator comprising:
  (a) an exciter portion comprising:
    (i) an EMF generator comprising:
      (A) an AC periodic signal generator containing an exciter frequency; and
      (B) an amplifier containing an amplifier input and an amplifier output, the amplifier input conductively connected with the AC periodic signal generator; and
    (ii) a current transformer conductively connected with the amplifier output of the EMF generator; and (b) a detector portion comprising:
   (i) a Rogowski coil;
   (ii) a filter containing a filter input and a filter output, the filter input conductively connected with the Rogowski coil, the filter approximately tuned such that a signal at the exciter frequency of the AC periodic signal generator arriving at the filter input is substantially transmitted to the filter output; and
   (iii) a readout connected with the filter output,
whereby the readout indicates the presence of a ground loop when a ground loop exists in conductors linked by the current transformer of the exciter portion and the Rogowski coil of the detector portion.

2. A ground loop locator as set forth in claim 1, further comprising a housing substantially housing the ground loop locator.

3. A ground loop locator as set forth in claim 1, further comprising:
   (a) an exciter housing substantially housing the exciter portion; and
   (b) a detector housing substantially housing the detector portion.

4. A ground loop locator as set forth in claim 3, wherein the exciter housing is detachably connected with the detector housing.

5. A ground loop locator as set forth in claim 1, wherein:
   (a) the filter further comprises a lock-in amplifier;
   (b) the filter further comprises a phase-reference input;
   (c) the AC periodic signal generator further comprises a phase reference output; and
   (b) a phase reference link connects the phase reference output and the phase reference input,
whereby phase information from the phase reference output of the AC periodic signal generator of the exciter portion is coupled into the phase reference input and shared with the lock-in amplifier of the detector portion via the phase reference link.

6. A ground loop locator as set forth in claim 5, wherein the phase reference link is an electrical conductor.

7. A ground loop locator as set forth in claim 5, wherein the phase reference link is an optical fiber.

8. A ground loop locator as set forth in claim 5, wherein the phase reference link is a transmitter/receiver pair, wherein the transmitter is connected with the exciter portion and the receiver is connected with the detector portion.

9. A ground loop locator as set forth in claim 8, wherein the transmitter/receiver pair communicate with radiation substantially within the infrared portion of the electromagnetic spectrum.

10. A ground loop locator as set forth in claim 1, wherein the filter further comprises a filter amplifier having a filter amplifier gain.

11. A ground loop locator as set forth in claim 10, wherein the filter amplifier gain is adjustable, whereby the ground loop locator can be made more or less sensitive by adjusting the signal amplifier gain.

12. A ground loop locator as set forth in claim 1, wherein the Rogowski coil is openable.

13. A ground loop locator as set forth in claim 1, wherein the Rogowski coil comprises a first coil portion and a second coil portion, the first coil portion hingedly connected with the second coil portion, whereby the Rogowski coil can easily be wrapped around cables or groups of cables.

14. A ground loop locator as set forth in claim 1, wherein the Rogowski coil is flexible such that the Rogowski coil can be elastically deformed, whereby the Rogowski coil can be used while pressed against a surface.

15. A ground loop locator as set forth in claim 14, wherein the Rogowski coil has a hollow core.

16. A ground loop locator as set forth in claim 1, wherein the readout comprises:
   (a) an approximately linear rectifier containing a rectifier input and a rectifier output, the rectifier input conductively connected with the filter output;
   (b) an integrator containing an integrator input and an integrator output, the integrator input conductively connected with the rectifier output; and
   (c) a display connected with the integrator output, the display providing a display output that is approximately proportional to voltages on the integrator output,
whereby the display provides an approximately proportional representation of the current flowing in ground loops detected by the ground loop locator.

17. A ground loop locator as set forth in claim 1, wherein the readout comprises:
   (a) an approximately linear rectifier containing a rectifier input and a rectifier output, the rectifier input conductively connected with the filter output;
   (b) a display connected with the rectifier output, the display providing a display output that is approximately proportional to the average voltage on the rectifier output,
whereby the display provides an approximately proportional representation of the current flowing in ground loops detected by the ground loop locator.

18. A ground loop locator as set forth in claim 17, wherein the DC power source is an AC/DC converter, and the ground loop locator can be directly powered by AC power via the AC/DC converter.

19. A ground loop locator as set forth in claim 1, wherein the readout comprises:
   (a) a comparator containing a comparator threshold; and
   (b) an indicator,
whereby the indicator provides a binary representation of whether the current flowing in ground loops detected by the ground loop locator is above the comparator threshold.

20. A ground loop locator as set forth in claim 1, wherein the transformer is a split-core transformer, whereby the transformer can easily be wrapped around cables or groups of cables.

21. A ground loop locator as set forth in claim 1, wherein the exciter frequency of the AC periodic signal generator is greater than 5 kilohertz.

22. A ground loop locator as set forth in claim 1, further comprising a DC power source, whereby the ground loop locator operates using energy from the DC power source.

23. A ground loop locator as set forth in claim 22, wherein the DC power source is a battery.

24. A ground loop locator comprising:
   (a) an exciter portion comprising:
      (i) an EMF generator comprising an AC periodic signal generator containing an exciter frequency; and
      (ii) a current transformer conductively connected with the AC periodic signal generator of the EMF generator; and (b) a detector portion comprising:
  (i) a Rogowski coil;
  (ii) a filter containing a filter input and a filter output, the filter input conductively connected with the Rogowski coil, the filter approximately tuned such that a signal at the exciter frequency of the AC periodic signal generator arriving at the filter input is substantially transmitted to the filter output; and
  (iii) a readout connected with the filter output, whereby the readout indicates the presence of a ground loop when a ground loop exists in conductors linked by the current transformer of the exciter portion and the Rogowski coil of the detector portion.

* * * * *